United States Patent [19]
Andersson et al.

[11] Patent Number: 5,764,524
[45] Date of Patent: Jun. 9, 1998

[54] METHOD AND APPARATUS FOR DETECTION OF MISSING PULSES FROM A REPETITIVE PULSE TRAIN

[75] Inventors: Claes Georg Andersson, Fremont; Bradley R. Lewis, Gilroy; Charles N. Villa, San Jose, all of Calif.

[73] Assignee: Snap-On Technologies, Inc., Lincolnshire, Ill.

[21] Appl. No.: 599,772

[22] Filed: Feb. 12, 1996

[51] Int. Cl.⁶ .................................................. G01R 23/00
[52] U.S. Cl. ........................ 364/486; 364/484; 364/485; 364/487; 364/569; 327/18; 327/20; 377/16; 377/19; 377/20
[58] Field of Search ........................ 327/18, 20; 377/28, 377/15–17, 19, 20; 324/76.11, 76.12, 76.16, 76.19, 76.24, 76.15, 76.38, 76.39, 76.42, 76.41, 76.47, 76.48, 76.58, 76.55, 76.62, 76.74, 76.82; 364/480, 481, 483–487, 550, 551.01, 575, 576, 579, 569

[56] References Cited

U.S. PATENT DOCUMENTS

| | | | |
|---|---|---|---|
| 4,628,269 | 12/1986 | Hunninghaus et al. | 327/20 |
| 4,670,711 | 6/1987 | Daniels | 324/76.16 |
| 4,845,608 | 7/1989 | Gdula | 377/17 |
| 5,128,973 | 7/1992 | Sasaki et al. | 377/28 |
| 5,198,750 | 3/1993 | Prokin | 324/76.42 |
| 5,233,545 | 8/1993 | Ho et al. | 364/569 |
| 5,471,402 | 11/1995 | Owen | 364/484 |
| 5,493,515 | 2/1996 | Batchelder et al. | 364/481 |
| 5,495,168 | 2/1996 | de Vries | 364/487 |

*Primary Examiner*—James P. Trammell
*Assistant Examiner*—Hal D. Wachsman
*Attorney, Agent, or Firm*—Claude A. S. Hamrick

[57] ABSTRACT

A method and apparatus for detection of missing pulses from a repetitive pulse train including signal detection circuits for capturing the rising and/or falling edges of an input signal, time-stamping the captured edges, calculating the maximum and minimum instantaneous frequency over a specified time period, and displaying such frequency values. Instantaneous frequency values between any two adjacent edges are calculated based upon the time-stamps of the edges. The instantaneous frequency values in a specified time period are then sorted to find the minimum and maximum frequency values for that time period. These instantaneous frequency values are displayed in the form of a histogram evidencing the occurrence or lack of occurrence of missing pulses from the input signal.

15 Claims, 2 Drawing Sheets

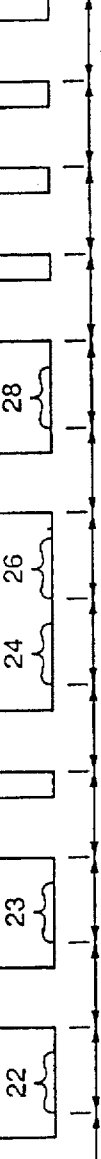

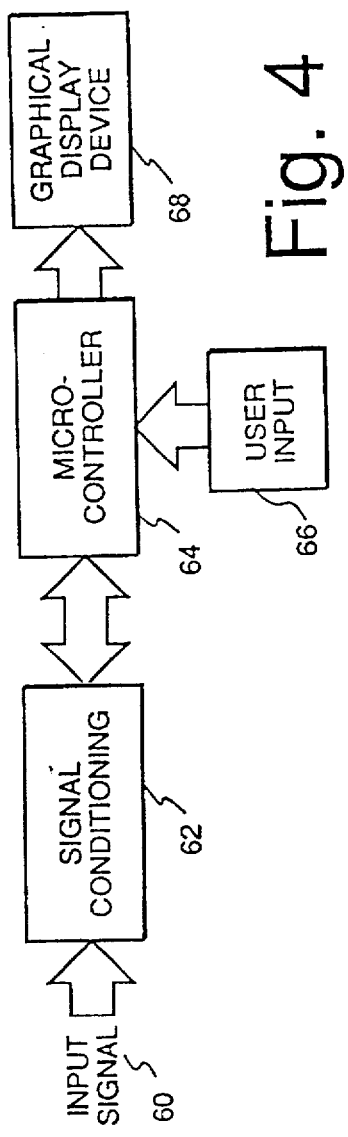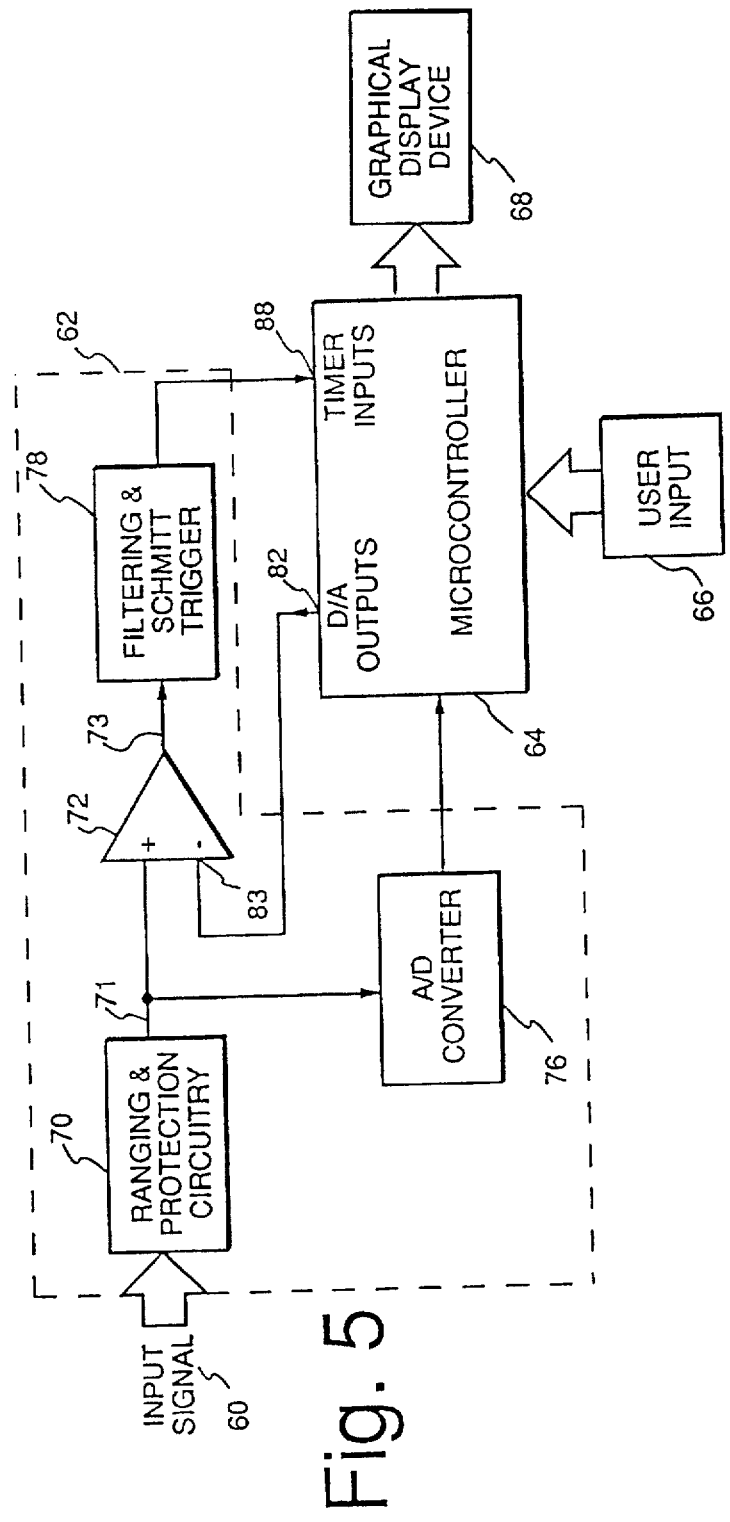

METHOD AND APPARATUS FOR DETECTION OF MISSING PULSES FROM A REPETITIVE PULSE TRAIN

BACKGROUND OF THE INVENTION

1. Field of the Invention

The present invention relates generally to electronic signal measurement apparatus, and more particularly to a short-duration anomalous signal event acquisition and display system wherein the maximum and minimum frequency of a pulse train signal over a predefined time period is detected, stored, processed and then read out at a slower rate for display in electronic strip chart format to highlight signal anomalies.

2. Description of the Prior Art

In the automotive repair field, as well as in other fields, it has long been important to have instruments available for measuring electrical signals occurring at various points within the numerous electrical circuits and signal paths resident in an automobile. Measurements of parameters such as current, voltage, resistance, signal frequency, etc. enable a repair technician to locate and diagnose the numerous problems that occur in a vehicle. Such parameters are typically measured using available apparatus ranging from simple voltage, current and resistance-measuring meters to sophisticated, computerized electronic diagnostic equipment.

Among the most difficult conditions to measure are the intermittent faults commonly referred to as "glitches", i.e. short duration signal events, one type of which being intermittent missing pulses from a periodic signal. Normal repetitive periodic signals are illustrated by FIGS. 1a, 1b, and 1c, where FIG. 1a is periodic square wave, FIG. 1b is a periodic triangular wave, and FIG. 1c is a periodic clipped sine wave. All three of these normal periodic signals have a pulse in every cycle. The type of glitches discussed herein relate to missing pulses from a periodic signal. For example, a normal operating subsystem would generate a repetitive pulse train having no missing pulses like the signal illustrated in FIG. 1a, while a faulty subsystem might generate a repetitive pulse train with intermittent missing pulses like that of FIG. 2. Some of the automotive components or subsystems generating periodic signals include crank shaft sensors, cam shaft sensors, mass air flow sensors, vehicle speed sensors, and in some vehicles, pressure sensors. The frequency of these signals typically ranges from ½ Hz to 20 kHz. While the disclosure herein discusses square wave forms, the principles and concepts equally apply to other types of periodic signals.

Previous measurement systems such as the oscilloscope and frequency counters prove to be problematic in identifying and displaying these types of glitches. For example, an oscilloscope requiring complex and expensive electronics would have a difficult time triggering on a periodic signal with missing pulses simply because it is difficult to trigger on non-existent or intermittently existing signals. Even if the oscilloscope does manage to trigger on the signal and display the signal, due to the intermittent nature of such glitches, the missing pulse(s) may be displayed for a fraction of a second on the scope and an operator of the scope may fail to observe or identify such anomaly.

In the case of frequency counters, the frequency of a periodic wave form is taken over a relatively long period of time (up to 1 second) and a frequency value in accordance with the classical definition of frequency in cycles per second is calculated and displayed. This frequency value provides no indication of missing pulses and tends to hide any anomalies or missing pulses within the signal. A more indicative value would be the maximum and minimum instantaneous frequency of a periodic signal calculated over one or more periods of the periodic signal where such value can be displayed in a histogramic format allowing the operator to observe changes in frequency of a periodic signal to identify missing pulses.

There is thus a need for a relatively simple means for detecting and indicating the occurrence or non-occurrence of glitches in electrical circuits. Furthermore, there is a need for a device that "captures" a glitch and displays its occurrence in a continuously moving histogramic format so that the user does not have to carefully watch the indicator to notice the transient occurrence of a glitch.

SUMMARY OF THE INVENTION

It is therefore an object of the present invention to provide an improved apparatus for monitoring electrical signals to detect and indicate the occurrence or non-occurrence of rapidly varying events, commonly referred to as glitches.

Another objective of the present invention is to provide glitch-detection and display apparatus that is simple to use and relatively low in cost.

Another object of the present invention is to provide apparatus of the type described which allows workers not experienced in the use of complex test instruments to observe short duration faults.

Still another object of the present invention is to provide apparatus of the type described that does not rely on user observation of the fault at the instant of its occurrence.

Yet another object of the present invention is to provide a system of the type described for detecting rapidly varying events using limited computational capacity for the event to be detected.

Briefly, the present invention is embodied in the form of a hand-held instrument which includes circuits for detection of missing pulses from a repetitive pulse train and including signal detection circuits for capturing the rising and/or falling edges of an input signal, time-stamping the captured edges, calculating the maximum and minimum instantaneous frequency over a specified time period, and displaying such frequency values. Instantaneous frequency values between any two adjacent edges are calculated based upon the time-stamps of the edges. The instantaneous frequency values in a specified time period are then sorted to find the minimum and maximum frequency values for that time period. These instantaneous frequency values are displayed in the form of a histogram evidencing the occurrence or lack of occurrence of missing pulses from the input signal.

An important advantage of the present invention is that it indicates the occurrence of otherwise difficult-to-detect events in a readily perceptible fashion.

Another advantage of the present invention is that it provides a histographic display of the occurrence of the events over a period of time.

Still another advantage of the present invention is that it can be used by workers inexperienced in the use of sophisticated test equipment.

These and other objects and advantages of the present invention will no doubt become apparent to those skilled in the art after having read the following detailed description of the preferred embodiment which is illustrated in the several figures of the drawing.

IN THE DRAWING

FIG. 1a is a diagram illustrating a periodic square wave form typical of the type encountered in automotive diagnostics;

FIG. 1b is a diagram illustrating a periodic wave form of the triangular type;

FIG. 1c is a diagram illustrating another periodic wave form of the clipped sine wave type;

FIG. 2 is a diagram illustrating an anomalous periodic square wave with intermittent missing pulses;

FIG. 3a is a display in realtime or near realtime frequency of the wave form illustrated in FIG. 2 for a particular sample period;

FIG. 3b is another display in realtime or near realtime frequency of the wave form illustrated in FIG. 2 for another sample period;

FIG. 3c is another display in realtime or near realtime frequency of the wave form illustrated in FIG. 2 for yet another sample period;

FIG. 4 is a block diagram generally illustrating the principal operative components of the present invention;

FIG. 5 is a block diagram illustrating in detail the principal functional components of the signal conditioner illustrated in FIG. 4.

DETAILED DESCRIPTION OF THE PREFERRED EMBODIMENT

In FIG. 2 of the drawing, a periodic square signal trace typical of the type of signal that might be detected in an automotive circuit is shown at 20. Depicted at 22, 24, 26, and 28 are signal glitches of the type mentioned above, i.e., missing pulses of intermittent nature normally indicative of some component malfunction or shorting condition.

Conceptually, an input signal that may be periodic is received and conditioned for processing, where the rising edges (or falling edges) of the input signal are detected. Upon detecting rising edges (or falling edges), time entries are made to record the events to allow later calculations of the time lapse between rising edges (or falling edges). By knowing the time lapse between two edges, the instantaneous frequency based upon the two edges can be calculated. By continuously calculating the instantaneous frequency and sorting the resulting frequency values over a specified time period, a maximum frequency value and a minimum frequency value for the time period can be determined and displayed in a histogramic format. It is understood that the detection of either the rising edges or the falling edges operates under the same principles.

For example, referring to FIG. 2, each cycle (period) of the square wave is as respectively indicated by P1, P2, P3, . . . , P16, where the time scale goes from right to left. Although pulses for periods P1–P5, P7, P10, P11, P13, and P15–P16 are normal pulses, the pulses for periods P6, P8, P9, P12, and P14 do not exist. By detecting the rising edges as they occur and recording the time of their occurrences, the rising edges of the pulses for periods P1–P5, P7, P10, P11, P13, and P15–P16 are recorded, and the maximum and minimum frequency values over a defined time interval can thereby be determined.

A general algorithm for determining the maximum frequency value and the minimum frequency value over a specified time interval in the preferred embodiment of the present invention comprises steps providing for the calculation of frequency values between all the adjacent rising edges, and steps providing for the selection of the maximum and minimum frequency values from the calculated frequency values within the specified time intervals.

If the defined time interval corresponds to four cycles, the maximum and minimum frequency values over periods P1', P2', P3', and P4' can be determined, and a corresponding histogram depicting the maximum and minimum frequency values over the several time periods would be as illustrated in FIG. 3a. Each column of the histogram corresponds to a specified time interval of the periodic signal and there is a top horizontal bar indicating the maximum frequency value and a bottom horizontal bar indicating the minimum frequency value found over the time interval. More specifically, column 30 corresponds to period P1' where there are no missing pulses and the maximum and minimum frequency values, as indicated at 31 and 32, are the same. For period P1', because there are five rising edges and the time elapsed between any two adjacent rising edges are the same, the maximum and minimum frequency values are therefore the same. Column 34 corresponds to period P2' where there are two missing pulses and the maximum frequency value 33 is obtained from the calculation of the time elapsed between rising edges of a the pulses in periods P4 and P5, and the minimum frequency value 35 is obtained from the calculation of the time elapsed between rising edges of the pulses in periods P5 and P7. For column 36, the minimum frequency is determined from periods P7 and P10 since no pulses were received at the border of P2' to P3'. The maximum frequency is determined from the time between periods P10 to P11. Column 38 shows the maximum and minimum frequency values (37 and 39) calculated over a period where there are three rising edges to allow for the calculation of two frequency values. One frequency value is calculated from the time elapsed between the rising edges of periods P13 and P15, and the other frequency value is obtained from the time elapsed between the rising edges of periods P15 and P16.

If the frequency value is calculated over a time period corresponding to five cycles of the periodic signal as shown by periods P1", P2", and P3", the corresponding histogram would be as illustrated in FIG. 3b where column 40 corresponds to the maximum and minimum frequency values calculated over period P1", column 44 corresponds to the frequency values calculated over period P2", and column 46 corresponds to the frequency values calculated over period P3". For period P1", there are six rising edges and the time elapsed between any two adjacent rising edges are the same, resulting in the situation where the maximum and minimum frequency values are the same. For period P2", there are three rising edges to allow for the calculation of two frequency values, and the maximum frequency value thus is obtained from the calculation of the time elapsed between the rising edges of periods P5 and P7 and the minimum frequency values is obtained from the calculation of the time elapsed between the rising edges of periods P7 and P10. For period P3", the maximum frequency value is obtained from the calculation of the time elapsed between the rising edges of periods P10 and P11, and the minimum frequency value is obtained from the calculation of the time elapsed between the rising edges of periods P11 and P13 (or P13 and P15).

FIG. 3c illustrates the histogram for time intervals corresponding to six cycles of the pulse train where column 48 corresponds to period P1* and column 50 corresponds to period P2*. For period P1*, the maximum and minimum frequency values are the same. For period P2*, the maximum frequency value is obtained from the calculation of the time elapsed between the rising edges of periods P10 and P11, and the minimum frequency value is obtained from the calculation of the time elapsed between the rising edges of periods P7 and P10.

The maximum and minimum frequency values can be calculated over a time interval that is automatically determined by an algorithm implemented by microcontroller 64 or it can be userselectable. By choosing different time intervals for sorting and selecting maximum and minimum frequency values, the histogram can be displayed at a variety of display rate for observation by the user.

Referring now to FIG. 4, a generalized block diagram illustrating the major subsystems of the preferred embodiment of the present invention includes a signal conditioner 62 for receiving and conditioning the input signal 60, a microcontroller 64 for receiving user signals from a user input device 66 and conditioned input signals from the signal conditioner 62, and a graphical display device 68 for displaying processed signals received from the microcontroller 64.

As is further expanded in FIG. 5, the signal conditioner 62 is comprised of Ranging and Protection circuitry 70, a comparator 72, and Filtering and a Triggering circuit 78. The protection circuitry protects the circuit from excessive power or power surges and the ranging circuitry adjusts the input voltage to a level acceptable to the downstream circuitry. A typical acceptable signal level is within the range plus/minus 2.5 volts for presentation to the comparator 72 and A/D converter 76.

The adjusted voltage from the Ranging and Protection circuitry 70 is then sampled by the analog-to-digital converter 76 to provide digital values for input to the microcontroller. The sampled digital values provide a basis for the microcontroller to determine the magnitude of the adjusted input signals appearing on line 71, and to generate a reference threshold voltages at digital/analog output port 82 for input to comparator 72 at 83. The reference threshold voltage can be a positive or negative threshold voltage that the adjusted input signal on line 71 must exceed in order to cause comparator 72 to generate a signal on lines 73. The signals generated by the comparator is filtered and the signal edges are made sharp by the Filtering and Trigger circuitry 78. The signal is then passed on to timer input port 88 of the microcontroller 64. Note that the threshold voltage is set only once for a particular input signal.

Initially, the microcontroller 64 evaluates the sampled voltages received from A/D converter 76 over a preset period of time and determines the threshold voltage level that the adjusted input voltage on line 71 must exceed in order to be detected as a rising edge (or a falling edge) identifying a pulse. The microcontroller 64 then sets the threshold voltage for comparator 72. Should the adjusted input signal on line 71 exceed the threshold voltage it will cause the comparator to generate a signal which is then filtered and pulse shaped by the Filtering and Trigger circuitry 78. The microcontroller then receives the processed signal at timer input port 88 as a signal event and timestamps the event. The microcontroller then performs frequency calculations based upon the time-stamps of the received signal events, and the calculated frequency values over a specified time interval is sorted and the maximum and minimum frequency values are determined. The maximum and minimum frequency values are subsequently passed to the graphical display device 68 (FIG. 4) and displayed in a histogramic or other format.

For high frequency periodic signals, the signal can be sampled over multiple periods and the occurrence of one or more missing pulses occurring during the sample period will still be detected and can be displayed. Implementation wise, a divide-by-2 hardware circuit can be placed between the Filtering and Schmitt Trigger circuit 78 and the timer input port 88.

As actually implemented, the present invention forms part of a graphing, digital multimeter and diagnostic database instrument manufactured by Balco, a division of Snap-on Incorporated, of San Jose, Calif. It will be appreciated, however, that the invention could be embodied as a stand-alone unit or as a component part of another indicator or diagnostic system.

Furthermore, although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A system for detecting missing pulses from a pulse train input signal by calculating and displaying maximum and minimum frequency values of pulses occurring during predetermined time periods, comprising:

signal ranging means for receiving said input signal and generating therefrom an adjusted input signal consisting of pulses having voltage levels within a predetermined voltage range;

analog-to-digital converter means for sampling said adjusted input signal to generate digital values representative thereof, comparator means for comparing said adjusted input signal and a threshold voltage to generate a comparison signal each time the amplitude of a pulse of said adjusted input signal exceeds said threshold voltage;

graphical display means; and microcontroller means for receiving said digital values and determining said threshold voltage from said digital values, for receiving the comparison signal and recording a corresponding time entry upon each receipt thereof, said microcontroller means calculating maximum and minimum frequency values during successive predetermined time periods based upon differences between the time entries, and passing said maximum and minimum frequency values to said graphical display means for display.

2. A system as recited in claim 1 wherein said graphical display means displays said maximum frequency value and said minimum frequency value in a histogramic format with a horizontal bar indicating said maximum frequency value and a horizontal bar indicating said minimum frequency value.

3. A system as recited in claim 2 and further including a user input means operatively connected to said microcontroller means for specifying said predetermined time periods.

4. A system as recited in claim 2 and further including a user input means operatively connected to said microcontroller means for specifying said predetermined time periods.

5. A system as recited in claim 4 and further including a filter means operatively connecting said comparator means to said microcontroller means for filtering the comparison signal before passing the comparison signal to said microcontroller means.

6. A system as recited in claim 5 and further including a Schmitt Trigger means operatively connecting said comparator means to said microcontroller means for sharpening the edge of the comparison signal before passing the comparison signal to said microcontroller means.

7. A system as recited in claim 6 wherein said signal ranging means includes circuit protection means to prevent said input signal from damaging the system.

8. A system as recited in claim 1 and further including a filter means operatively connecting said comparator means to said microcontroller means for filtering the comparison signal before passing the comparison signal to said microcontroller means.

9. A system as recited in claim 1 and further including a Schmitt Trigger means operatively connecting said comparator means to said microcontroller means for sharpening the edge of the comparison signal before passing the comparison signal to said microcontroller means.

10. A system as recited in claim 1 wherein said signal ranging means includes circuit protection means to prevent said input signal from damaging the system.

11. A method for detecting missing pulses from a pulse train input signal by calculating and displaying maximum and minimum frequency values of pulses occurring during predetermined time periods, comprising the steps of:

(a) receiving and adjusting the magnitude of said input signal so that it falls within a predetermined voltage range;

(b) sampling said adjusted input signal to generate digital values representative thereof;

(c) determining a threshold voltage having a predetermined relationship to a particular characteristic of the pulses of said pulse train input signal from said digital values;

(d) comparing said adjusted input signal and said threshold voltage to generate a comparison signal each time said adjusted input signal exceeds said threshold voltage;

(e) recording a time entry upon the occurrence of each said comparison signal;

(f) calculating maximum and minimum frequency values occurring during predetermined time periods based upon differences between the time entries; and (g) displaying said frequency values.

12. A method as recited in claim 11 wherein each of said frequency values is obtained from a calculation based on two consecutive time entries.

13. A method as recited in claim 12 wherein said frequency values relating to said predetermined time periods are continuously sorted, and said maximum frequency value and said minimum frequency value are determined from said sorted frequency values for each said time period.

14. A method as recited in claim 13 wherein said maximum frequency values and said minimum frequency values are displayed in a histogramic format.

15. A method as recited in claim 13 wherein said predetermined time periods are user selectable.

* * * * *

Disclaimer 5,764,524—Claes Georg Andersson, Fremont; Bradley R. Lewis, Gilroy; and Charles N. Villa, San Jose, all of Calif. METHOD AND APPARATUS FOR DETECTION OF MISSING PULSES FROM A REPETITIVE PULSE TRAIN. Patent dated Jun. 9, 1998. Disclaimer filed Aug. 31, 1998, by the assignee, Snap-On Technologies, Inc.

Hereby enters this disclaimer to claim 3 of said patent.

*(Official Gazette,* November 17, 1998)